(12) United States Patent
Tucker et al.

(10) Patent No.: US 7,061,761 B2
(45) Date of Patent: Jun. 13, 2006

(54) SYSTEM AND METHOD FOR COOLING COMPONENTS IN AN ELECTRONIC DEVICE

(75) Inventors: Sean W. Tucker, Loveland, CO (US); Tom J. Searby, Greeley, CO (US); Arlen L. Roesner, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 154 days.

(21) Appl. No.: 10/903,956

(22) Filed: Jul. 30, 2004

(65) Prior Publication Data

US 2006/0023420 A1 Feb. 2, 2006

(51) Int. Cl.
*H05K 7/20* (2006.01)

(52) U.S. Cl. .................. 361/695; 361/690; 361/694; 174/16.1; 165/104.33; 165/122; 454/184

(58) Field of Classification Search ........... 361/695, 361/694, 719; 165/104.33, 122; 454/184; 174/16.1, 16.3
See application file for complete search history.

(56) References Cited

U.S. PATENT DOCUMENTS

| | | | | |
|---|---|---|---|---|
| 5,523,917 A | | 6/1996 | Searby | |
| 5,734,551 A | * | 3/1998 | Hileman et al. | 361/695 |
| 6,034,870 A | * | 3/2000 | Osborn et al. | 361/690 |
| 6,462,948 B1 | * | 10/2002 | Leija et al. | 361/697 |
| 6,504,718 B1 | * | 1/2003 | Wu | 361/695 |
| 6,654,244 B1 | * | 11/2003 | Laufer et al. | 361/695 |
| 6,678,157 B1 | * | 1/2004 | Bestwick | 361/695 |
| 6,785,145 B1 | * | 8/2004 | Wong | 361/752 |

* cited by examiner

*Primary Examiner*—Boris Chérvinsky (57) ABSTRACT

In certain embodiments, a system for cooling components of an electronic device includes a chassis having a base, sides, and a removable cover disposed over the sides; a first component, a second component, and a third component disposed in the chassis; and a duct disposed in the chassis. In some embodiments, a duct includes a passage, an inlet to the passage, and an outlet from the passage, wherein the passage is disposed over the first component but not over the second and third components; and an upper member disposed against the removable cover lengthwise along the duct, wherein the duct and the upper member are configured to separate the second component from the third component in substantially different regions within the chassis. In particular embodiments, the system also includes a fan disposed angularly in the duct, such that the fan can provide an airflow in an angular direction relative to the first component.

20 Claims, 10 Drawing Sheets

SYSTEM AND METHOD FOR COOLING COMPONENTS IN AN ELECTRONIC DEVICE

BACKGROUND OF THE RELATED ART

Fans are often disposed in electronic devices, such as computers, to cool the various internal components. Unfortunately, these fans do not adequately cool certain components within the electronic devices. For example, one or more fans are often mounted on a wall of the electronics chassis, yet the airflow provided by these fans circulates over the top of the components rather than across them. Insufficient air circulation results in higher temperatures for these components. This lack of circulation is particularly problematic for smaller components, such as random access memory (RAM) modules, chips, and other low profile modules disposed on a circuit board.

In addition, components in an electronic device are often not adequately isolated from one another. For example, a typical computer includes one or more processors, memory modules, option cards, disk drives, and other electronics, which generate different levels of heat within the computer chassis. Unfortunately, existing computers generally do not isolate the hot components, such as processors and memory, from one another. As a result, the fans circulate the air from one set of hot components at least partially over another set of hot components, thereby undesirably heating these neighboring components. This additional heat can lead to malfunctions and failure of these components.

The fans also tend to pass the air through the chassis without focusing the airflow on particular components. For example, a chassis often has a front fan to cool a first set of components and a rear fan to cool a second set of components. The problem with this configuration is that the airflow generated by the front fan bypasses the first set of components and circulates the air directly through the rear fan. As a result, the airflow is inadequate to cool the various components. The typical solution is to increase the fan speeds to provide the desired airflow, which unfortunately causes higher noise levels within the chassis.

SUMMARY

In certain embodiments, a system for cooling components of an electronic device includes a chassis having a base, sides, and a removable cover disposed over the sides; a first component, a second component, and a third component disposed in the chassis; and a duct disposed in the chassis. In some embodiments, a duct includes a passage, an inlet to the passage, and an outlet from the passage, wherein the passage is disposed over the first component but not over the second and third components; and an upper member disposed against the removable cover lengthwise along the duct, wherein the duct and the upper member are configured to separate the second component from the third component in substantially different regions within the chassis. In particular embodiments, the system also includes a fan disposed angularly in the duct, such that the fan can provide an airflow in an angular direction relative to the first component.

DETAILED DESCRIPTION

Figure 1:
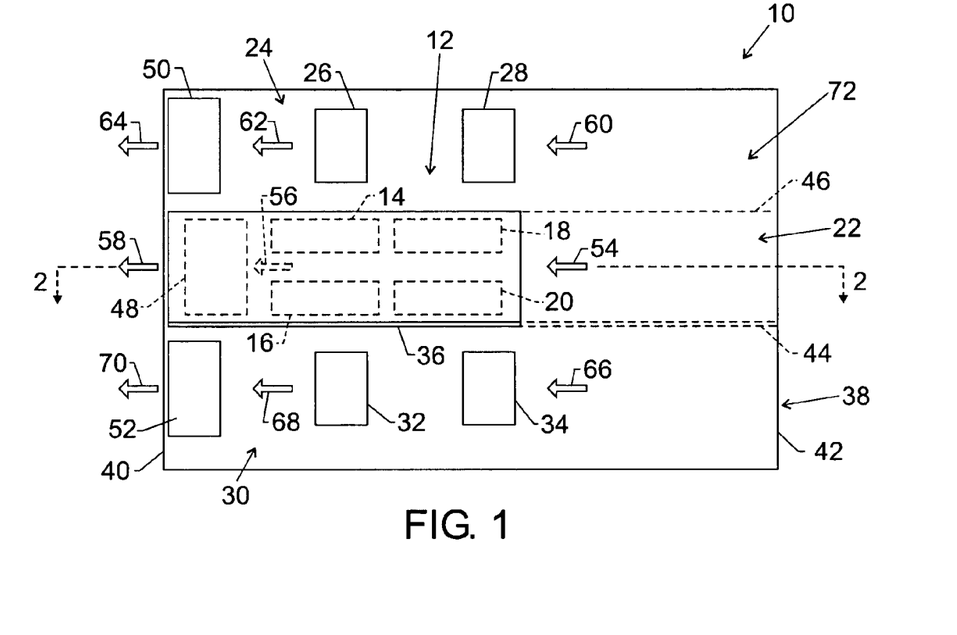
FIG. 1 is a diagrammatical top view of an electronic device having a duct disposed over a component in accordance with embodiments of the present invention.

FIG. 1 is a diagrammatical top view of a system for cooling components of an electric device. The system includes an electronic device 10 having a duct 12 disposed over electronic components 14, 16, 18, and 20 in accordance with embodiments of the present invention. As discussed in further detail below, the duct 12 is configured to isolate different component regions, including a first component region 22 having the electronic components 14, 16, 18, and 20, a second component region 24 having electronic components 26 and 28, and a third component region 30 having electronic components 32 and 34. Moreover, the illustrated duct 12 is configured to focus an airflow around the electronic components 14, 16, 18, and 20. In certain embodiments, the electronic device 10 is a computer, such as a notebook computer, a tablet personal computer, a desktop computer, a server, a network device, or another processor-based device. Embodiments of the electronic components 14, 16, 18, 20, 26, 28, 32, and 34 include integrated circuits, random access memory (RAM), processors, audio circuitry, video circuitry, network circuitry, option cards, disk drives, and so forth. Accordingly, the duct 12 can isolate a variety of components to improve cooling of those particular components. In context of the illustrated embodiments, isolation means to set apart or substantially separate the components, thereby substantially reducing or cutting off circulation between the separated components. Moreover, in context of the illustrated embodiments, the duct 12 refers to a channel and/or a substantially enclosed passage for conveying air across and about at least one of the components. Some embodiments of the duct 12 are partially enclosed by structures of the electronic device 10, such as fixed or removable panels, circuit boards, and other devices.

As illustrated in FIG. 1, the duct 12 includes a chamber isolation member, such as a wall or an upper rib 36. The upper rib 36 cooperates with structures of the duct 12, a chassis or housing 38, and/or other portions of the electronic device 10 to isolate the second component region 24 from the third component region 30. In other words, the duct 12 and the upper rib 36 form a wall or barrier between the second and third component regions 24 and 30, thereby reducing air circulation between the second and third component regions 24 and 30. As a result, the duct 12 and upper rib 36 substantially block the heat generated by electronic components 26 and 28 within the second component region 24 from circulating to the electronic components 32 and 34 within the third component region 30, and vice versa. Moreover, the duct 12 substantially blocks the heat generated by electronic components 14, 16, 18, and 20 within the first component region 22 from circulating to the components 26 and 28 and the components 32 and 34 within the second and third component regions 24 and 30, respectively. In this manner, the duct 12 and upper rib 36 provide significant isolation or separation of the first, second, and third component regions 22, 24, and 30. Separation of these regions reduces undesirable heat circulation and forms separate compartments or chambers for cooling airflows through these regions 22, 24, and 30.

In the illustrated embodiment of FIG. 1, the duct 12 and upper rib 36 extend partially from one side wall 40 toward (but not reaching) an opposite side wall 42 of the housing 38. As a result, the first, second, and third component regions 22, 24, and 30 are not entirely isolated from one another. However, the duct 12 and upper rib 36 substantially separate these different regions 22, 24, and 30, such that heat is not freely circulated from components in one region to components in the other regions. In alternative embodiments, the duct 12 and upper rib 36 extend to the side wall 42, as indicated by optional structures in broken lines 44 and 46. For example, the optional structure 44 may represent an extension of the upper rib 36, while the optional structure 46 may represent an extension of the duct 12. Alternatively, the optional structures 44 and 46 may represent portions of the housing 38 or other components disposed in the housing 38. These optional structures 44 and 46, when included in the electronic device 10, further isolate the first, second, and third component regions 22, 24, and 30.

Figure 2:
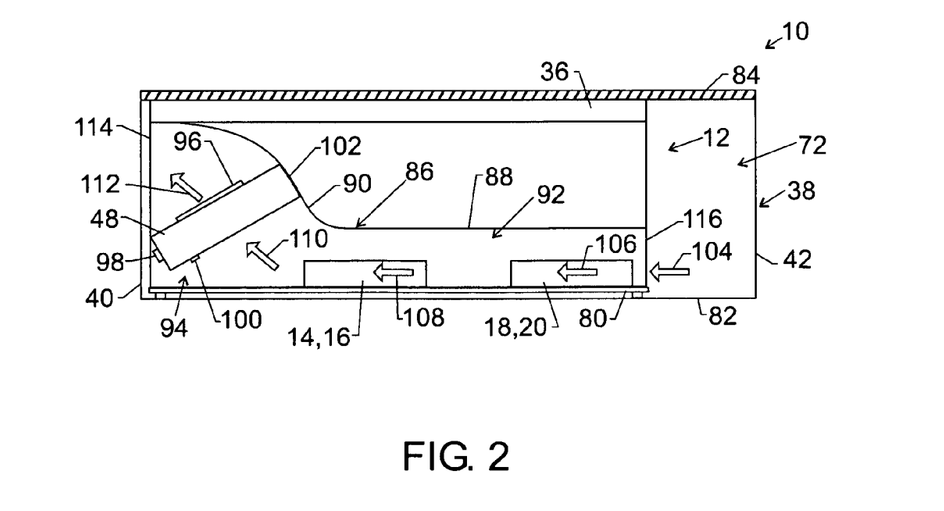
FIG. 2 is a diagrammatical side view of the electronic device of FIG. 1 in accordance with embodiments of the present invention.

The electronic device 10 illustrated in FIG. 1 also includes fans 48, 50, and 52 to cool the electronic components 14–20, 26–28, and 32–34 separately within the first, second, and third component regions 22, 24, and 30, respectively. For example, the fan 48 forces air to flow through the duct 12 and around the electronic components 14, 16, 18, and 20 in the first component region 22, as indicated by arrows 54, 56, and 58. In the second component region 24, the fan 50 forces air to flow around the electronic components 26 and 28 between the housing 38 and the duct 12 (and the upper rib 36), as indicated by arrows 60, 62, and 64. In the third component region 30, the fan 52 forces air to flow around the electronic components 32 and 34 between the housing 38 and the duct 12 (and the upper rib 36), as indicated by arrows 66, 68, and 70. In this manner, the fans 48, 50, and 52 all draw air from the same side 42 of the housing 38 in an upstream region 72 relative to the electronic components 14–20, 26–28, and 32–34 and the duct 12 (and the upper rib 36). Therefore, the air is not previously heated by the electronic components 14–20, 26–28, and 32–34 when the fans 48, 50, and 52 initially draw the air into the first, second, and third component regions 22, 24, and 30, as indicated by the arrows 54, 60, and 66. As the fans 48, 50, and 52 continue to draw the air into the regions 22, 24, and 30, the duct 12 and upper rib 36 effectively isolate the airflows 56, 62, and 68 passing across and around the electronic components 14–20, 26–28, and 32–34, respectively. In other words, the duct 12 and upper rib 36 facilitate a relatively focused or restricted airflow across and around the electronic components 14–20, 26–28, and 32–34 in each separate region 22, 24, and 30, respectively. This isolation and focus of the airflows 56, 62, and 68 increases the heat dissipation from the electronic components 14–20, 26–28, and 32–34 into the separate airflows 56, 62, and 68, respectively. Finally, the fans 48, 50, and 52 exhaust the heat transferred to these separate airflows 56, 62, and 68 as indicated by arrows 58, 64, and 70, respectively As illustrated in FIGS. 1 and 2, the duct 12 also includes certain features to focus the airflow across and around the electronic components 14, 16, 18, and 20. FIG. 2 is a diagrammatical side view of the electronic device of FIG. 1 in accordance with embodiments of the present invention. In the illustrated embodiment, the duct 12 is positioned on a circuit board 80 mounted to a base 82 of the housing 38. At the top of the electronic device 10, the upper rib 36 of the duct 12 is disposed against a cover 84, which is releasably coupled to sides 40 and 42 of the housing 38. In this manner, the duct 12 is sandwiched or compressively fit between the circuit board 80 and the cover 84. Therefore, the duct 12 and upper rib 36 substantially isolate the first, second, and third component regions 22, 24, and 30 (not shown), as discussed in detail above with reference to FIG. 1.

As further illustrated in FIG. 2, the duct 12 includes an inner passageway 86 having a first portion or restricted passage 88 and a second portion or expanded passage 90. The restricted passage 88 includes a component cooling region 92, where the electronic components 14, 16, 18, and 20 are mounted to the circuit board 80. The expanded passage 90 includes an angular fan mount or fan support structure 94, which supports the fan 48 at an angle relative to the electronic components 14, 16, 18, and 20 disposed within the component cooling region 92. In the illustrated embodiment, the fan support mechanism 94 includes a rear stop or retention member 96, a lateral guide or side retainer 98, and a front snap or latching member 100. Thus, the rear retention member 96 and the front latching member 100 secure the fan 48 from front to rear, while the side retainer 98 and a portion 102 of the inner passageway 86 secure the fan 48 from side to side.

In operation, the fan 48 forces air to flow through the inner passageway 86 as indicated by arrows 104, 106, 108, 110, and 112. In the illustrated embodiment, the fan 48 is positioned near an air outlet 114 from the air passageway 86, such that the fan 48 pulls heated air angularly upward from the electronic components 14, 16, 18, and 20 and out of the electronic device 10. In addition, an optional fan (not shown) can be positioned at an air inlet 116 into the air passageway 86 to provide redundancy and to increase the forced convection away from the electronic components 14, 16, 18, and 20. In alternative embodiments, the fan 48 forces the air to flow through the inner passageway 86 in the opposite direction. Similarly, the fans 50 and 52 illustrated in FIG. 1 may force the air to flow in the opposite direction in other embodiments. In this reversed configuration, the electronic device 10 may include the optional structures 44 and 46 (see FIG. 1) to separate the airflows heated by the electronic components 14–20, 26–28, and 32–34 from one another and from other components within the electronic device 10.

Referring back to the component cooling region 92 of FIG. 2, the restricted passage 88 forces the airflows 106 and 108 to flow across and around the electronic components 14, 16, 18, and 20. For example, the airflows 106 and 108 are focused on the electronic components 14, 16, 18, and 20, or around the electronic components along or at the top of the circuit board 80 rather than generally passing above and offset from the electronic components 14, 16, 18, and 20. The relatively small flow area of the restricted passage 80 also increases the flow rate through the component cooling region 92. Accordingly, the focused airflow and increased flow rate effectively increase the forced convection of heat away from the electronic components 14, 16, 18, and 20 into the airflows 106 and 108.

Turning to the expanded passage 90 of the duct 12 illustrated in FIG. 2, the angled orientation of the fan 48 directs the airflow 110 by the fan 48 in a direction that is angled upwardly from the component cooling region 92. For example, the airflow is initially directed in a path parallel to the circuit board 80 (shown at arrows 106 and 108) and then directed at an angle away from the circuit board 80 (shown at arrow 110). As a result, the angularly positioned fan 48 more effectively forces convective heat transfer away from the electronic components 14, 16, 18, and 20 disposed in the component cooling region 92. In other words, the angled airflow 110 directly pulls air from across and around the electronic components 14, 16, 18, and 20, rather than indirectly flowing air above and offset from the electronic components 14, 16, 18, and 20.

Figure 3:
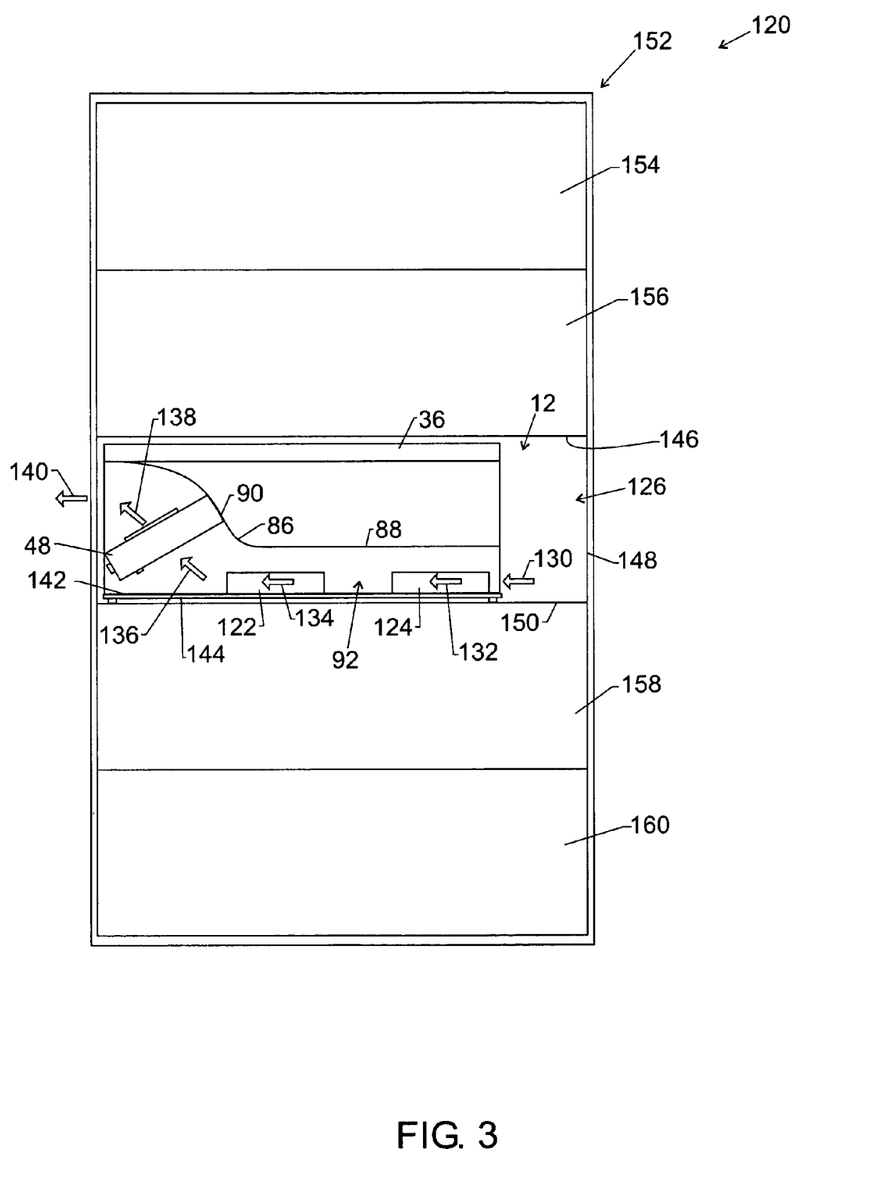
FIG. 3 is a diagrammatical side view of a rack system having a duct disposed over a component within a rack mounted device in accordance with embodiments of the present invention.

FIG. 3 is a diagrammatical side view of a rack system 120 having the duct 12 disposed over electronic components 122 and 124 within a rack mounted device 126 in accordance with embodiments of the present invention. As discussed in detail above, the restricted passage 88 of the duct 12 is configured to focus airflow across and around the electronic components 122 and 124, as indicated by arrows 130, 132, and 134. Further downstream in the expanded passage 90 of the duct 12, the angularly mounted fan 48 is configured to pull heated air in an angled direction upward and away from the electronic components 122 and 124, as indicated by arrow 136. The fan 48 then ejects the heated air outwardly from the rack mounted device 126, as indicated by arrows 138 and 140. In this manner, the duct 12 and angularly mounted fan 48 increase the convective heat transfer away from the electronic components 122 and 124. In other words, the duct 12 initially channels the air closely around surfaces of the electronic components 122 and 124 along the circuit board or base, wherein the heat generated by the components 122 and 124 transfers into the airflow. Subsequently, the expanded passage 60 of the duct 12 and the angularly mounted fan 48 directs this heated airflow outwardly and away from the circuit board and components 122 and 124. In this manner, the heated airflow does not heat components and portions of the circuit board surrounding the electronic components 122 and 124.

In addition, the duct 12 is configured to isolate different component regions within a housing 128 of the device 126, such that cooling airflows (not shown) can be separately focused across and around components in those different component regions. For example, the duct 12 and the upper rib 36 cooperate with structures inside the rack mounted device to form a wall between the different component regions. In the illustrated embodiment, a bottom portion 142 of the duct 12 rests on a circuit board 144 that supports the electronic components 122 and 124. The upper rib 36 of the duct 12 is disposed against an upper panel 146 of a chassis 148 of the rack mounted device 126. In other words, the duct 12 is sandwiched between the upper panel 146 and a base panel 150 of the chassis 148, such that the duct 12 and upper rib 36 form a chamber isolation structure or wall between the different component regions.

In the illustrated embodiment, the rack system 120 includes a rack structure 152 housing a plurality of rack mounted devices, including the device 126 and rack mounted devices 154, 156, 158, and 160. Embodiments of these rack mounted devices 126, 154, 156, 158, and 160 include a server, a display device, a keyboard, a network switch, a hub, a router, a firewall, and so forth. Although not illustrated in FIG. 3, each of these rack mounted devices 126, 154, 156, 158, and 160 may include an embodiment of the duct 12. The electronic components 122 and 124 can include integrated circuits, random access memory (RAM), processors, audio circuitry, video circuitry, network circuitry, option cards, disk drives, and so forth. Thus, embodiments of the duct 12 and the angularly mounted fan 48 can be used to cool a variety of components in small, medium, and large scale systems.

Figure 4:
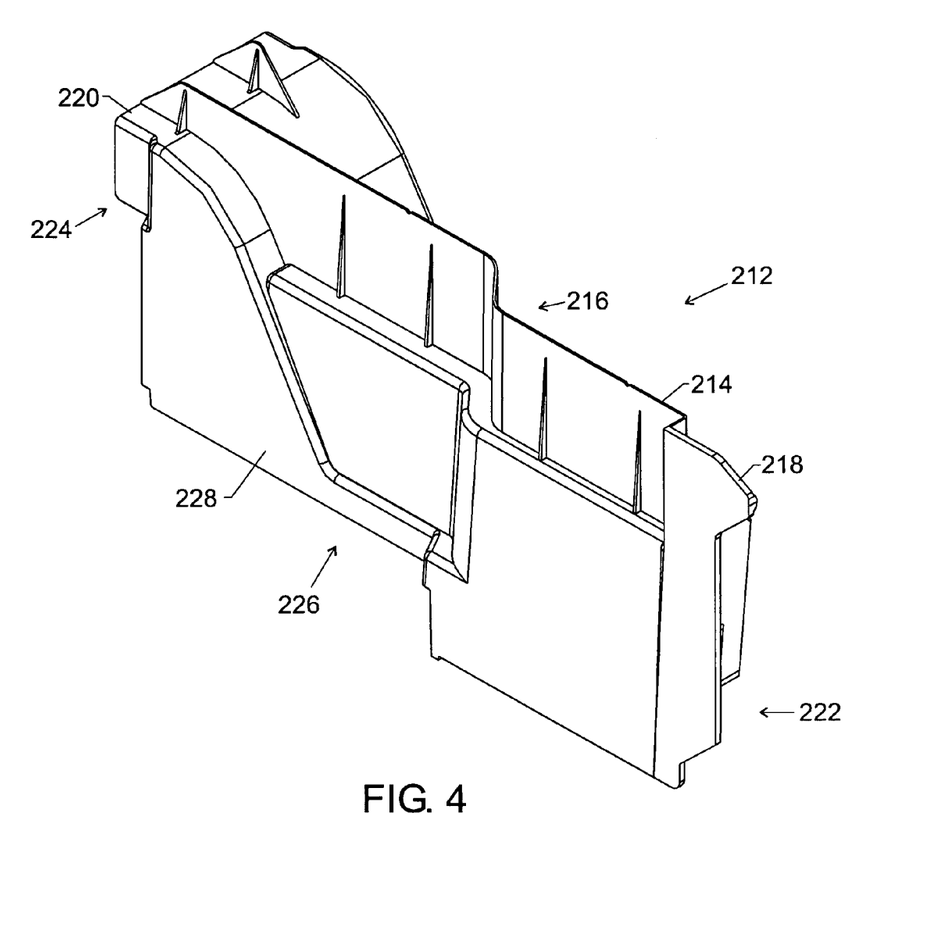
FIG. 4 is a top perspective view of a duct in accordance with embodiments of the present invention.
Figure 5:
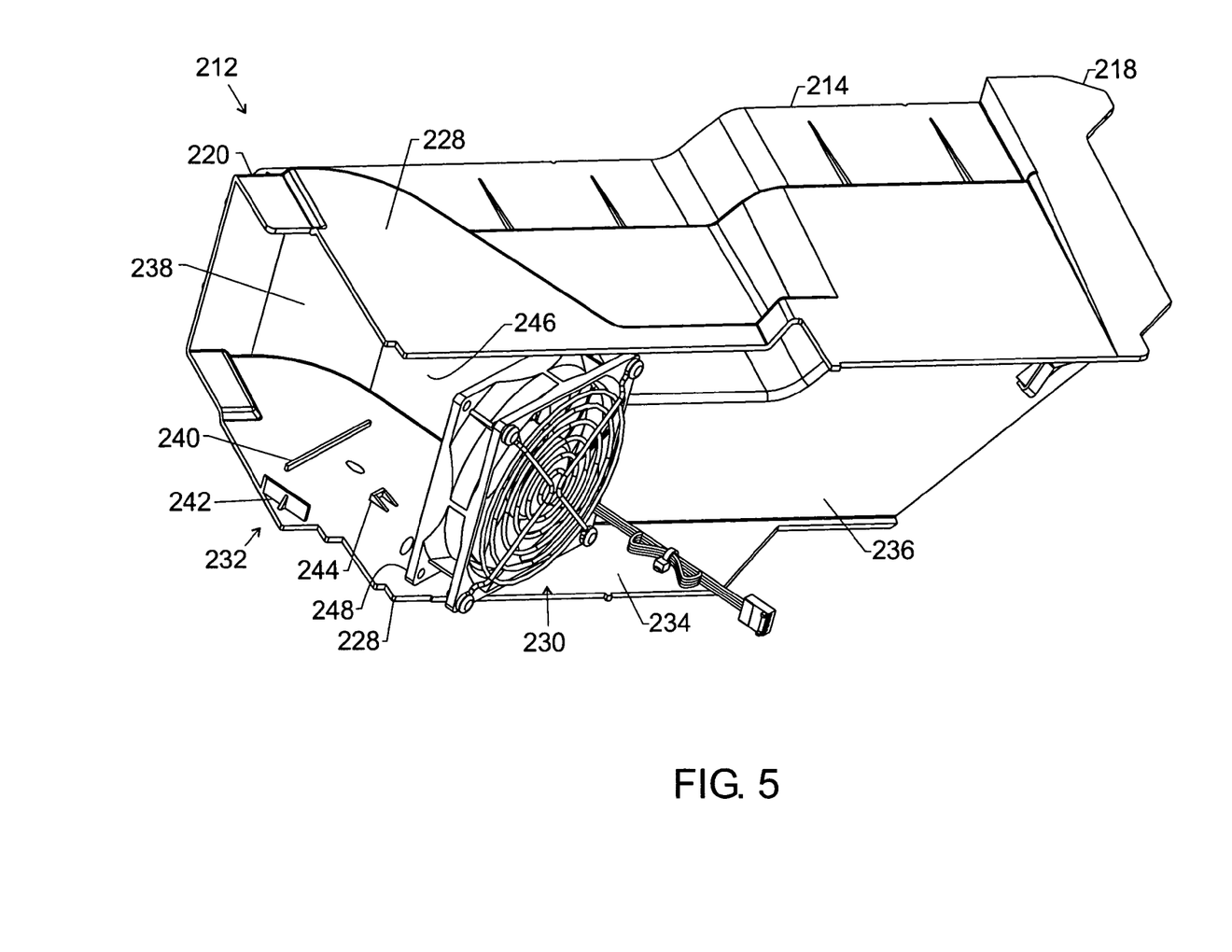
FIG. 5 is a bottom perspective view of the duct of FIG. 4 illustrating a fan exploded from an angled support mechanism in accordance with embodiments of the present invention.
Figure 6:
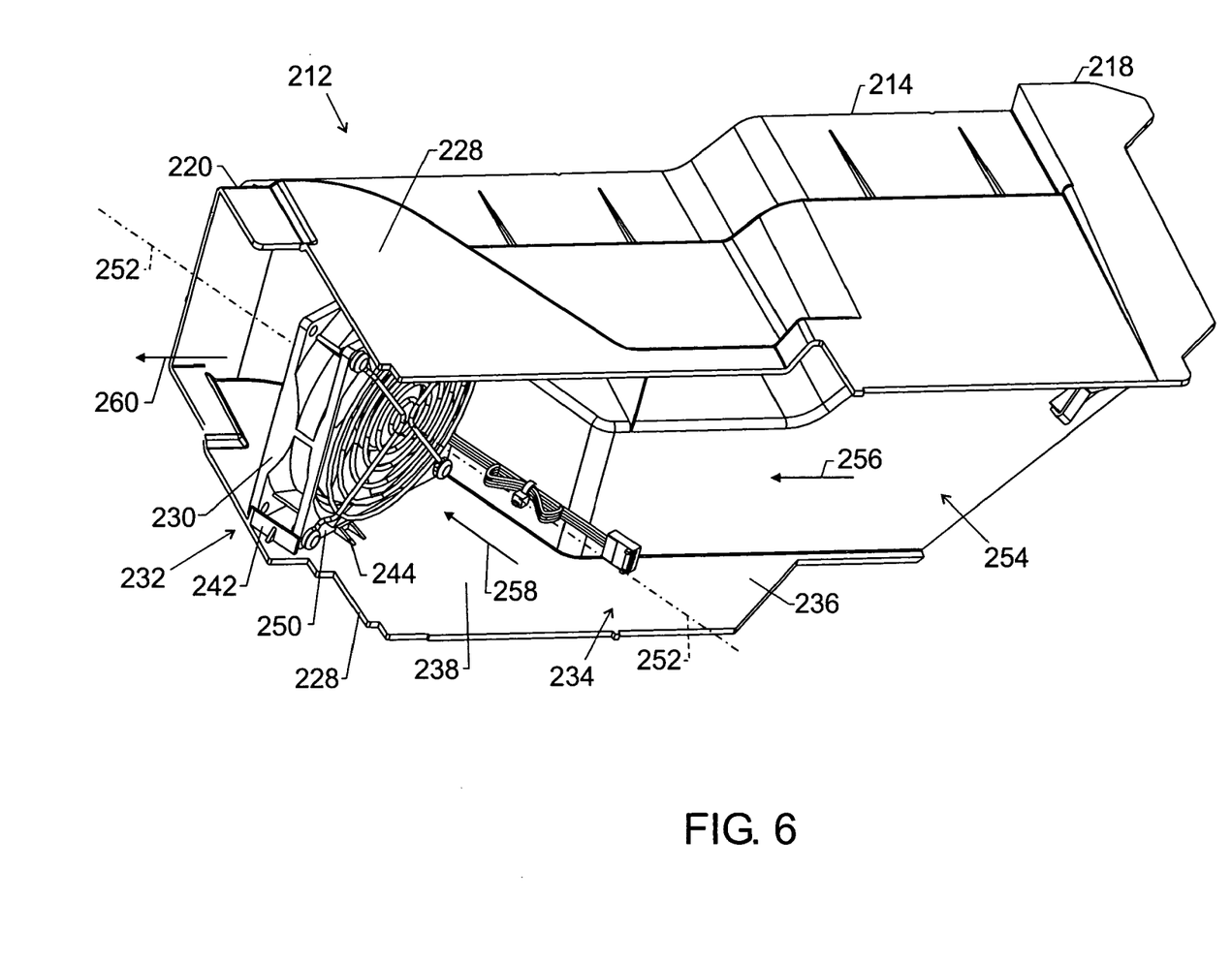
FIG. 6 is a bottom perspective view of the duct of FIGS. 4 and 5 illustrating the fan mounted in the angled support mechanism in accordance with embodiments of the present invention.

FIGS. 4, 5, and 6 illustrate a duct 212 in accordance with embodiments of the present invention. FIG. 4 is a top perspective view of the duct 212 illustrating a chamber isolation member or upper rib 214, which extends lengthwise along a top side 216 of the duct 212. The illustrated duct 212 also includes a slide mount member 218 and a lip mount member 220 at first and second ends 222 and 224, respectively. As discussed below with reference to FIGS. 7–11, these members 218 and 220 releasably secure the duct 212 within a chassis. In addition, the upper rib 214 is configured to abut an upper panel or cover of a chassis, while a bottom side 226 of the duct 212 is configured to rest on base structures or components with the chassis (not shown). In this manner, the duct 212 is sandwiched within the chassis, such that the upper rib 214 and walls 228 of the duct form a substantially continuous wall from the cover to the base structures of the chassis. As discussed in detail below, this substantially continuous wall facilitates isolation between different component regions within the chassis.

FIG. 5 is a bottom perspective view of the duct 212 of FIG. 4 illustrating a fan 230 exploded from an angled support mechanism 232 within an inner passageway 234 in accordance with embodiments of the present invention. As illustrated, the inner passageway 234 includes a first portion or restricted passage 236 and a second portion or expanded passage 238, which includes the angled support mechanism 232. Inside the expanded passage 238, the angled support mechanism 232 includes a rear position feature 240, a lateral alignment feature 242, and a front latching or tool-free securing feature 244 on opposite walls 228 of the duct 212.

As illustrated in FIGS. 5 and 6, the fan 230 is releasably mounted to the angled support mechanism 232 by inserting the fan 230 between the opposite walls 228, over and across the front latching or securing feature 244, between the lateral alignment feature 242 and an opposite portion 246 of the expanded passage 238, and against the rear position feature 240. As a rear portion 248 of the fan 230 moves into position against the rear position feature 240, the front latching or securing feature 244 snaps or latches about a front portion 250 of the fan 230. The fan 230 is releasable by depressing or disengaging the front latching or securing feature 244, thereby facilitating quick and tool-free removal of the fan 230 from the duct 212 in the reverse order of the foregoing mounting steps.

FIG. 6 is a bottom perspective view of the duct 212 of FIGS. 4 and 5 illustrating the fan 230 mounted in the angled support mechanism 232 in accordance with embodiments of the present invention. As illustrated, the fan 230 has an air flow axis 252 that is angled relative to the first portion or restricted passage 236 of the inner passageway 234. As discussed in further detail below with reference to FIGS. 7 and 8, the restricted passage 236 has a component cooling region 254 in which the one or more electronic components (not shown) are in an airflow path 256 toward the fan 230. The relatively small cross-section of the restricted passage 236 increases the flow rate through the component cooling region 254. The relatively small cross-section of the restricted passage 236 also forces the airflow path to extend across and around the electronic components, rather than passing indirectly above and offset from the electronic components. The fan 230 also pulls heated air from the component cooling region 254 in an angled flow path 258 generally aligned with the air flow axis 252. In other words, the angled flow path 258 further increases airflow from across and around the electronic components, rather than indirectly pulling air from areas farther away or offset from the electronic components. In this manner, the relatively small cross-section of the restricted passage 236 and the angled flow path 258 toward the fan 230 substantially increase the convective cooling of the electronic components disposed in the component cooling region 254.

Figure 7:
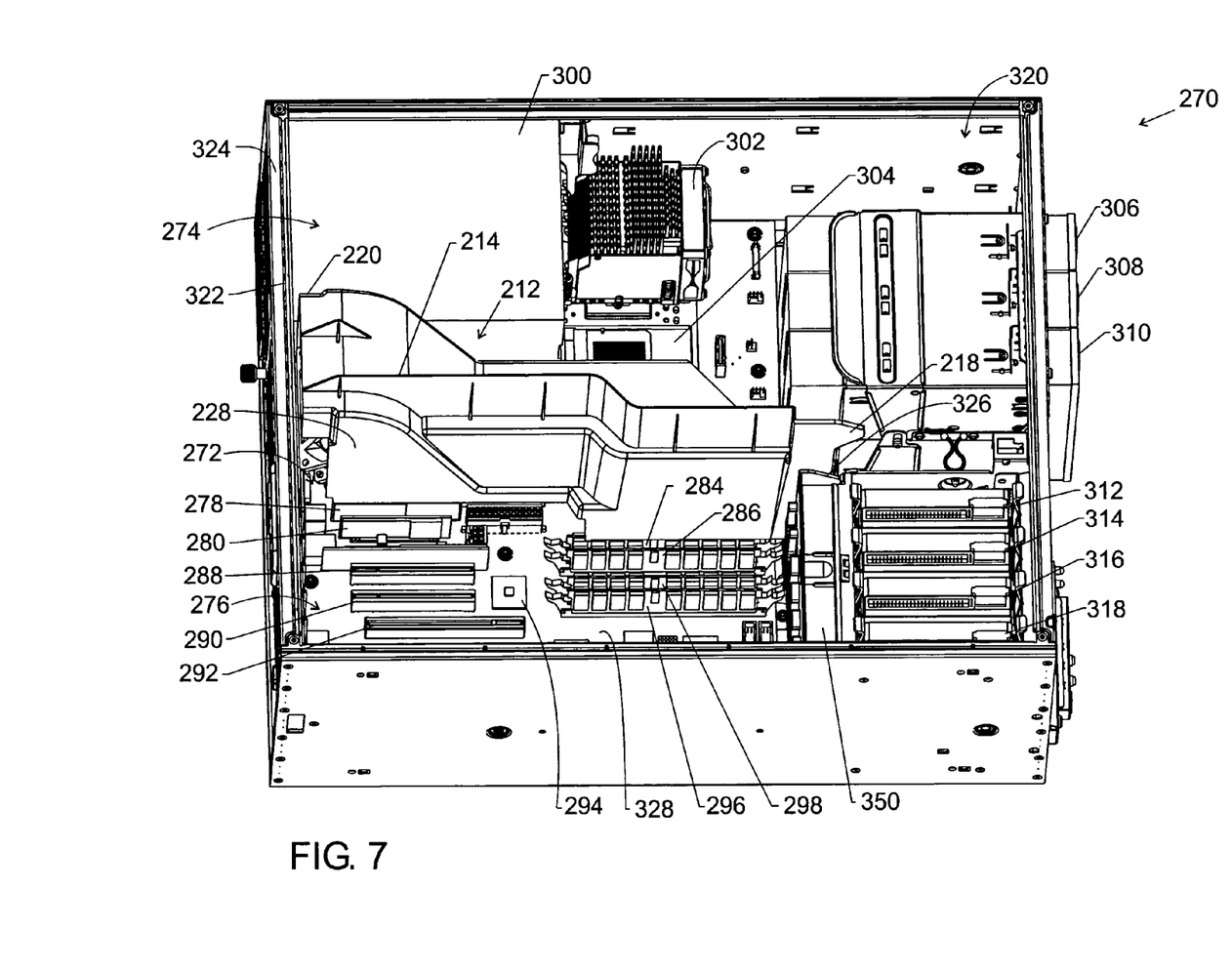
FIG. 7 is a top perspective view of a computer illustrating the duct of FIGS. 4–6 exploded from a first component region between second and third component regions in accordance with embodiments of the present invention.

FIG. 7 is a top perspective view of a computer 270 illustrating the duct 212 of FIGS. 4–6 exploded from a first component region 272 between second and third component regions 274 and 276 in accordance with embodiments of the present invention. As illustrated, the computer 270 has a variety of electronic components and devices disposed in the first, second, and third component regions 272, 274, and 276. For example, the first component region 272 includes electronic components 278, 280, 284, and 286. In the illustrated embodiment, these electronic components 278–286 include random access memory (RAM) modules, a memory controller chip (with optional heat sink), and various integrated circuits. The second component region 274 includes electronic components 300 and 302, which in the illustrated embodiment are a power supply (with fan) and a processor assembly (with heat sink and fan). In addition, the second component region 274 may include another processor assembly coupled to processor support structure 304. The third component region 276 includes electronic components 288, 290, 292, 294, 296, and 298. In the illustrated embodiment, these electronic components 288–298 include option card slots (and optional cards—not shown), integrated circuits, and RAM modules. The computer 270 also includes various other components and disk drives, such as drives 306, 308, 310, 312, 314, 316, and 318, in an upstream region 320 relative to the duct 212.

Figure 8:
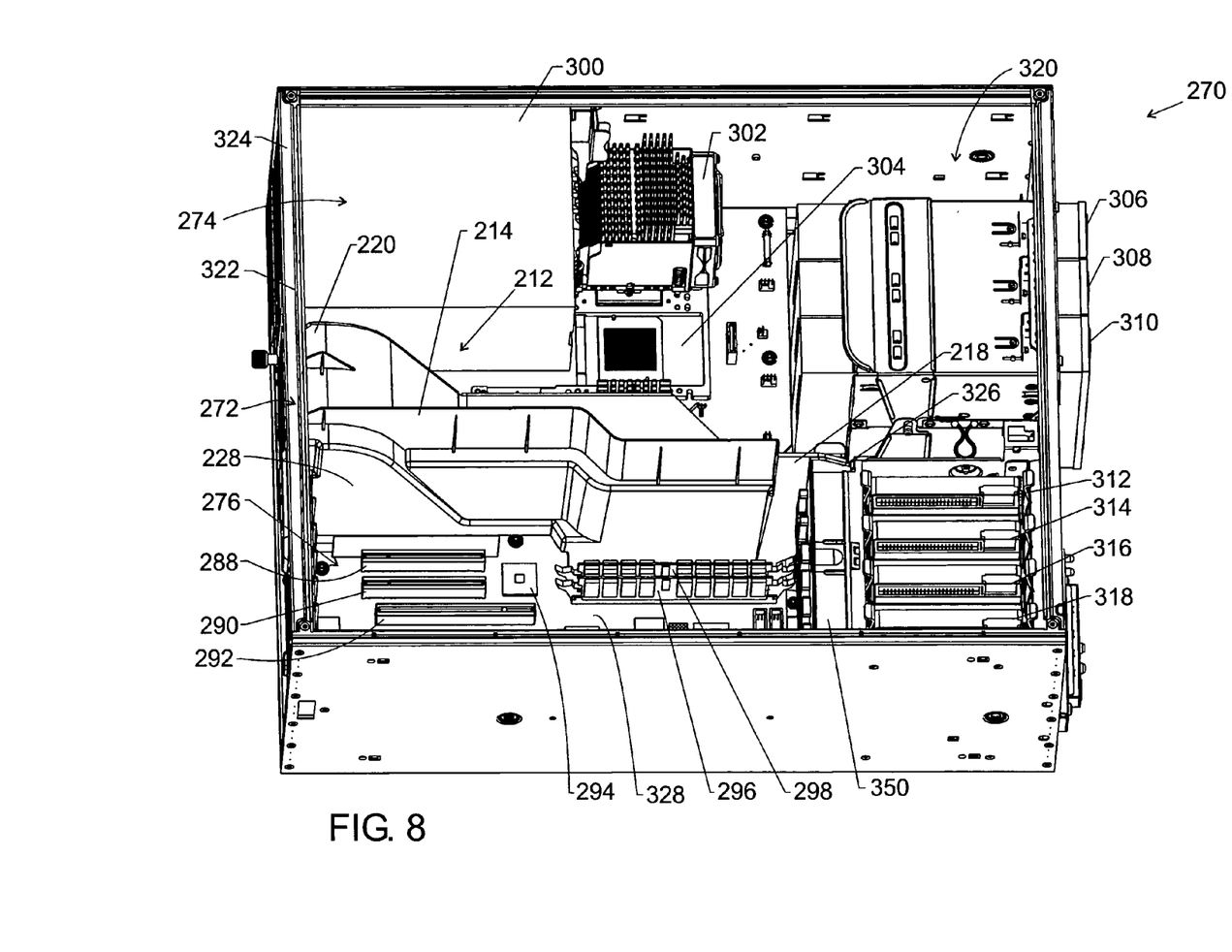
FIG. 8 is a top perspective view of the computer of FIG. 7 illustrating the duct of FIGS. 4–6 mounted over the first component region in accordance with embodiments of the present invention.

As illustrated in FIGS. 7 and 8, the duct 212 is lowered into the computer 270 over the electronic components 278, 280, 284, and 286 disposed in the first component region 272. In this process, the lip mount member 220 of the duct 212 is secured below an outer lip or peripheral edge 322 of a chassis 324 of the computer 270. In addition, the slide mount member 218 of the duct 212 is positioned downwardly into a mounting slot 326 within the chassis 324, thereby restricting lateral movement of the duct 212. At the top side 216 of the duct 212, the upper rib 214 is substantially aligned with the peripheral edge 322 of the chassis 324, such that a cover panel (not shown) abuts the upper rib 214 when attached to the chassis 324. In other words, the duct 212 becomes sandwiched between the cover panel and a base panel (or a circuit board 328) inside the chassis 324, thereby restricting vertical movement of the duct 212. In this manner, the lip mount member 220, the slide mount member 218, and the upper rib 214 cooperate with the chassis 324 to secure the duct 212 over the first component region 272. Given that the lip mount member 220, the slide mount member 218, and the upper rib 214 are tool-less mounting mechanisms, the duct 212 can be quickly installed and removed to gain access to the electronic components 278–286 positioned in the first component region 272.

Figure 9:
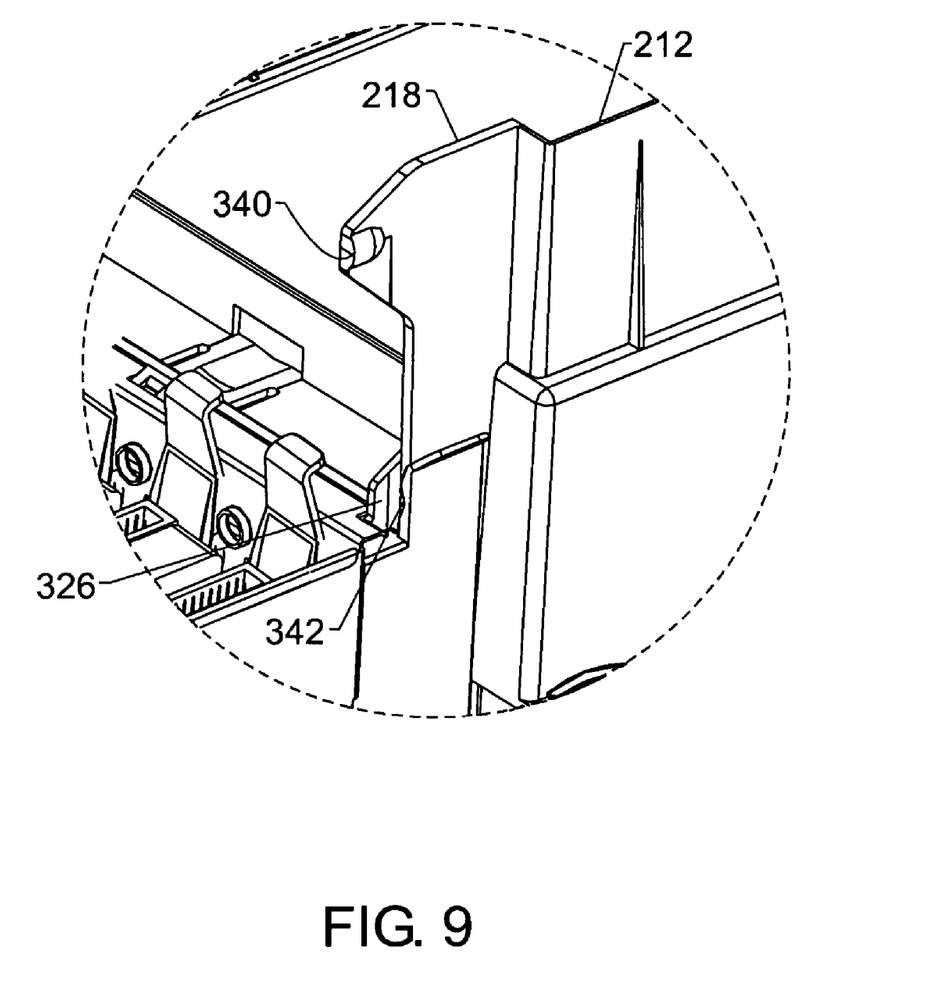
FIG. 9 is a partial top perspective view of the computer of FIG. 7 illustrating a portion of the duct of FIGS. 4–6 exploded from a mounting slot in accordance with embodiments of the present invention.

FIG. 9 is a partial top perspective view of the computer 270 of FIG. 7 illustrating the slide mount member 218 of the duct 212 of FIGS. 4–6 exploded from the mounting slot 326 in accordance with embodiments of the present invention. In the illustrated embodiment, the slide mount member 218 of the duct 212 includes a snap-fitting protrusion or latching member 340, which is configured to fit within a snap recess or latching receptacle 342 within the mounting slot 326.

Figure 10:
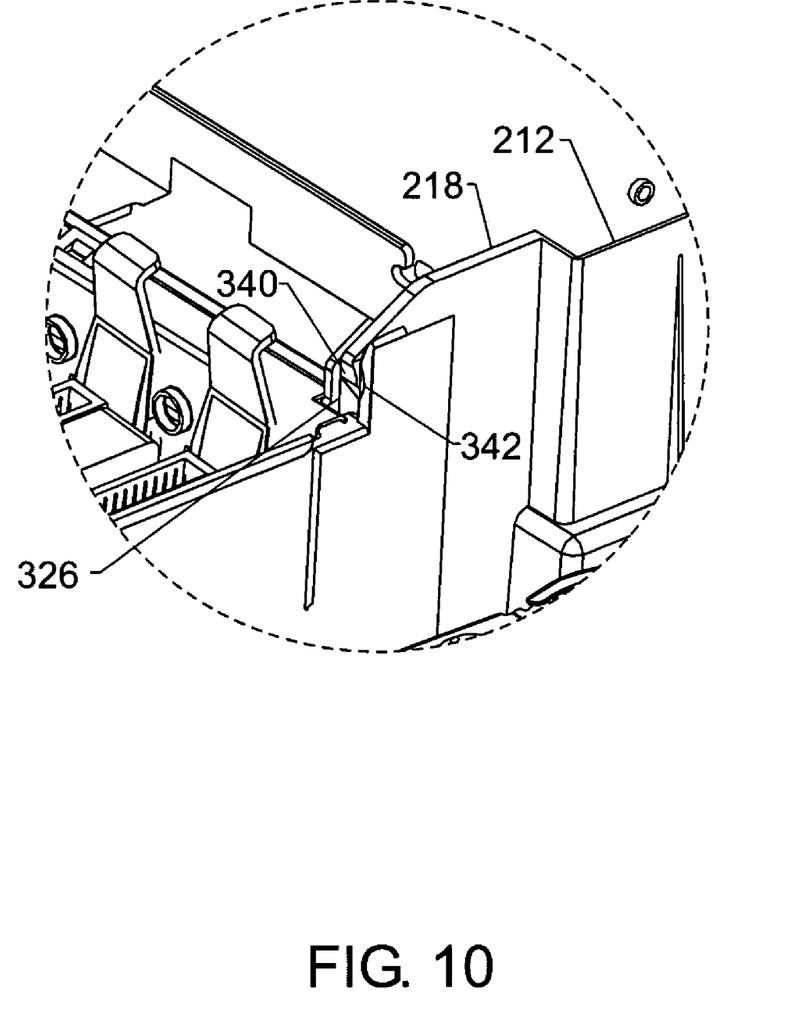
FIG. 10 is a partial top perspective view of the computer of FIG. 8 illustrating a portion of the duct of FIGS. 4–6 secured within a mounting slot in accordance with embodiments of the present invention.
Figure 11:
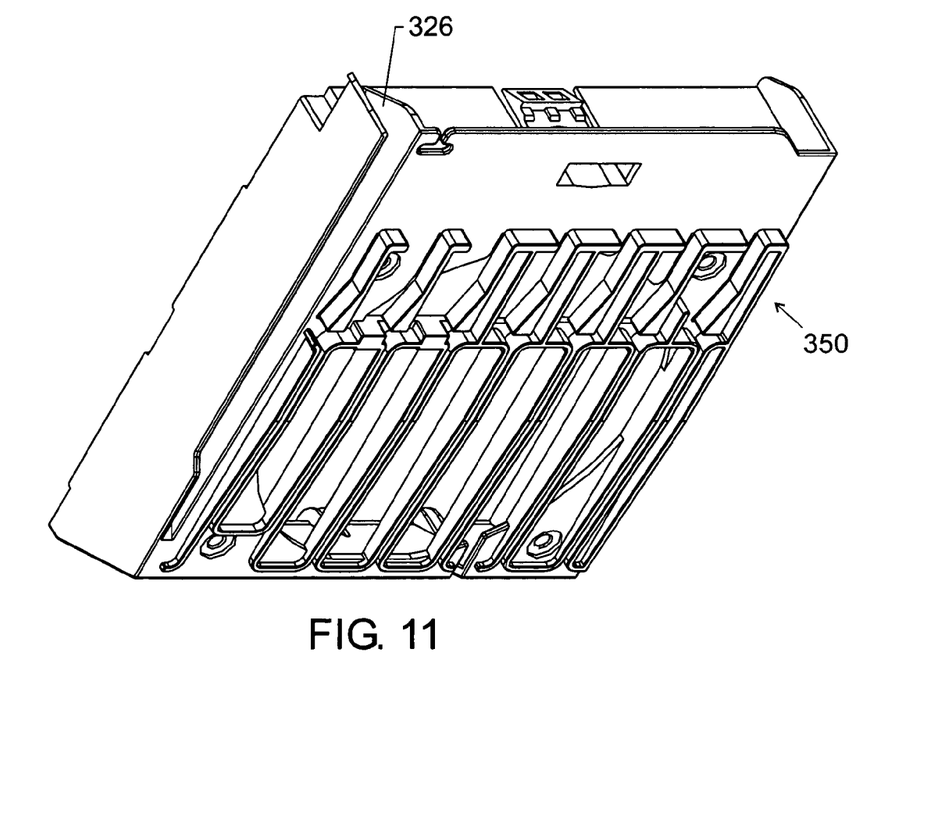
FIG. 11 is a perspective view of a fan housing having the mounting slot of FIGS. 9 and 10 in accordance with embodiments of the present invention.

FIG. 10 is a partial top perspective view of the computer 270 of FIG. 8 illustrating the slide mount member 218 of the duct 212 of FIGS. 4–6 secured within the mounting slot 326 in accordance with embodiments of the present invention. As illustrated, the latching member 340 is disposed within the latching receptacle 342, thereby providing a resistance to removal of the duct 212. In other words, cooperation of the slide mount member 218 within the mounting slot 326 restricts lateral movement, while the cooperation of the latching member 340 within the latching receptacle 342 restricts vertical movement of the duct 212. In certain embodiments, the mounting slot 326 is disposed in a portion of the chassis 324 or another component within the computer 270. For example, FIG. 11 is a perspective view of a fan housing 350 having the mounting slot 326 of FIGS. 7–10 in accordance with embodiments of the present invention. Again, these features facilitate tool-free mounting and removal of the duct 212 from the chassis 324 of the computer 270. In other embodiments, the duct 212 is mounted or secured within the computer 270 by snap-fit mechanisms, press-fit mechanisms, screws (e.g., thumb screws), hooks, latches, adhesives, pins, hinges, sliding mechanisms, and/or other mounting mechanisms.

Referring back to FIG. 8, the duct 12 substantially improves convective cooling within the computer 270. As discussed above, the walls 228 and upper rib 214 of the duct 212 at least partially block air circulation between the second and third component regions 274 and 276. Therefore, the cooling airflow in the second component region 274 is substantially isolated from the first and third component regions 272 and 276, thereby improving convective cooling of those components 300 and 302. Similarly, the cooling airflow in the third component region 276 is focused on the electronic components 288–298 to improve convective cooling of those components 288–298. Further, the cooling airflow through the duct 212 is substantially isolated from the second and third component regions 274 and 276, thereby improving convective cooling of those components 278–286. In this manner, the duct 212 at least partially isolates or separates the first, second, and third component regions 272, 274, and 276, thereby focusing the cooling airflows across and around the electronic components 278–286, 300–302, and 288–298 disposed in those regions 272, 274, and 276, respectively.

What is claimed is:

1. A system for cooling components of an electronic device, comprising:
   a chassis having a base, sides, and a removable cover disposed over the sides;

a first component, a second component, and a third component disposed in the chassis;

a duct disposed in the chassis, the duct comprising:
 a passage, an inlet to the passage, and an outlet from the passage, wherein the passage is disposed over the first component but not over the second and third components; and
 an upper member disposed against the removable cover lengthwise along the duct, wherein the duct and the upper member are configured to separate the second component from the third component in substantially different regions within the chassis; and a fan disposed angularly in the duct, such that the fan can provide an airflow in an angular direction relative to the first component.

2. The system of claim 1, wherein the first component comprises at least one of an integrated circuit and a memory module, and airflow in the passage is isolated from the second and third components.

3. The system of claim 1, wherein the duct is shaped to provide airflow in a first direction parallel to a circuit board of the electric device and in a second direction angled to the first direction.

4. The system of claim 1, the second direction is upward and away from the circuit board.

5. The system of claim 1, wherein at least one of the inlet and the outlet is disposed against one of the sides of the chassis.

6. The system of claim 1, wherein an upper portion of the duct is disposed under an upper lip along one of the sides of the chassis, such that the upper lip at least partially secures the duct within the chassis.

7. The system of claim 1, wherein a lateral portion of the duct is disposed within a slot within the chassis, such that the slot at least partially secures the duct within the chassis.

8. The system of claim 7, wherein the slot is disposed along a fan housing.

9. The system of claim 1, comprising second and third fans disposed in the chassis in the substantially different regions having the second and third components, respectively.

10. The system of claim 1, wherein the chassis is mounted in a rack with a plurality of other rack mounted devices.

11. A cooling device, comprising:
 a duct configured to mount within a chassis of an electronic device, the duct comprising:
 a passageway having an inlet and an exit, wherein the passageway includes a first portion and a second portion, wherein the first portion restricts air flow to a component cooling region, and the second portion includes a fan at an angle relative to the first portion; and
 a chamber isolation member disposed lengthwise along the duct, wherein the duct and the chamber isolation member are configured to separate at least two component regions outside of the duct.

12. The cooling device of claim 11, wherein the fan is angularly mounted in the second portion and produces an air flow that is angled with respect to the component cooling region.

13. The cooling device of claim 11, wherein the first portion has an open bottom in the component cooling region and the second portion is expanded and longer than the first portion.

14. The cooling device of claim 11, wherein the chamber isolation member comprises an upper rib configured to abut against a cover of the chassis.

15. A method for cooling components of an electronic device, comprising:
 routing an airflow through a duct having a channel disposed over a first electronic component within a chassis of the electronic device;
 directing the air flow, from a position inside the duct, in an angled direction relative to the first electronic component; and
 blocking circulation of the air flow between opposite external sides of the duct to provide separate cooling regions for second and third electronic components disposed within the chassis on the opposite sides, respectively.

16. The method of claim 15, wherein routing the air flow comprises restricting the airflow to the channel around the first electronic component.

17. The method of claim 15, wherein directing the airflow comprises angularly forcing heated air away from the first electronic component.

18. The method of claim 15, wherein routing and directing the air flow comprise focusing the airflow around the first electronic component in substantial isolation from air circulation around the second and third electronic components.

19. The method of claim 15, where blocking circulation comprises abutting a chamber isolation member of the duct against a cover of the chassis.

20. A system for cooling components of an electronic device, comprising:
 means for routing air across a first electronic component within a chassis of the electronic device;
 means for producing the air, from a position inside the means for routing, in an angled direction relative to the first electronic component; and
 means for blocking circulation of air between opposite external sides of the means for routing to provide separate cooling regions for second and third electronic components disposed within the chassis on the opposite sides, respectively.

* * * * *